(12) United States Patent
Stempfl

(10) Patent No.: US 12,375,042 B2
(45) Date of Patent: Jul. 29, 2025

(54) DEVICE AND METHOD FOR SWITCHING A FREQUENCY RANGE OF A HIGH FREQUENCY AMPLIFIER

(71) Applicant: Rohde & Schwarz GmbH & Co. KG, Munich (DE)

(72) Inventor: Sebastian Stempfl, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 639 days.

(21) Appl. No.: 17/742,685

(22) Filed: May 12, 2022

(65) Prior Publication Data

US 2023/0103586 A1 Apr. 6, 2023

(30) Foreign Application Priority Data

Oct. 1, 2021 (EP) ..................................... 21200505

(51) Int. Cl.
*H03F 1/02* (2006.01)
*H03F 3/195* (2006.01)

(52) U.S. Cl.
CPC ........... *H03F 1/0288* (2013.01); *H03F 3/195* (2013.01); *H03F 2200/204* (2013.01)

(58) Field of Classification Search
CPC ... H03F 1/0288; H03F 3/195; H03F 2200/204
USPC .................................................. 330/124 R
See application file for complete search history.

(56) References Cited

U.S. PATENT DOCUMENTS

| 8,095,092 B2* | 1/2012 | Muller ................. H03G 1/0088 |
| | | 330/277 |
| 8,742,842 B2* | 6/2014 | Engala .................. H03F 1/0277 |
| | | 330/129 |
| 9,425,756 B2* | 8/2016 | Åkesson ................. H03F 3/602 |
| 2014/0062589 A1 | 3/2014 | Schenk | |
| 2016/0142023 A1 | 5/2016 | Jeon et al. | |

FOREIGN PATENT DOCUMENTS

WO 2004/088837 A2 10/2004

* cited by examiner

*Primary Examiner* — Hafizur Rahman
(74) *Attorney, Agent, or Firm* — Christensen O'Connor Johnson Kindness PLLC

(57) ABSTRACT

The present disclosure generally relates to a high frequency amplifier, a system and a method for setting an operating state of a high frequency amplifier. The high frequency amplifier includes at least a first amplification circuit with a first frequency range, at least one second amplification circuit with a second frequency range, a hybrid coupler circuit with an isolated port, and a termination with at least one switch device. The hybrid coupler circuit is connected to output sides of the first amplification circuit and the second amplification circuit. The termination is connected with the isolated port. The high frequency amplifier has an operating range based on the first amplification circuit and the second amplification circuit. The high frequency amplifier has a load modulation in dependence of the first amplification circuit and the second amplification circuit. A first contact of the at least one switch device is directly coupled to ground.

17 Claims, 11 Drawing Sheets

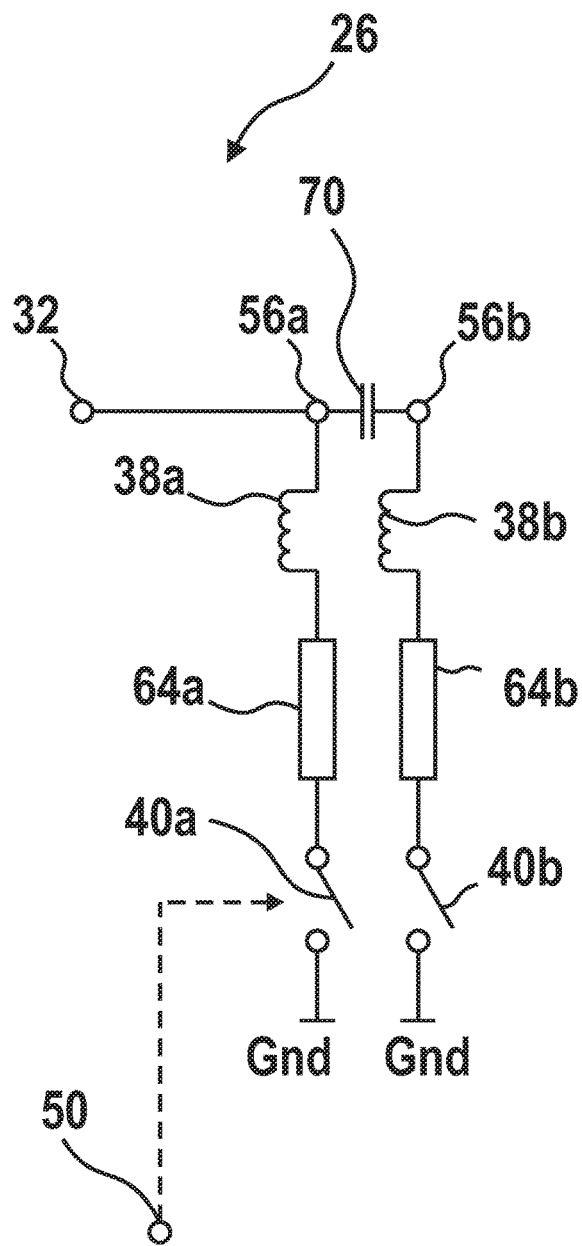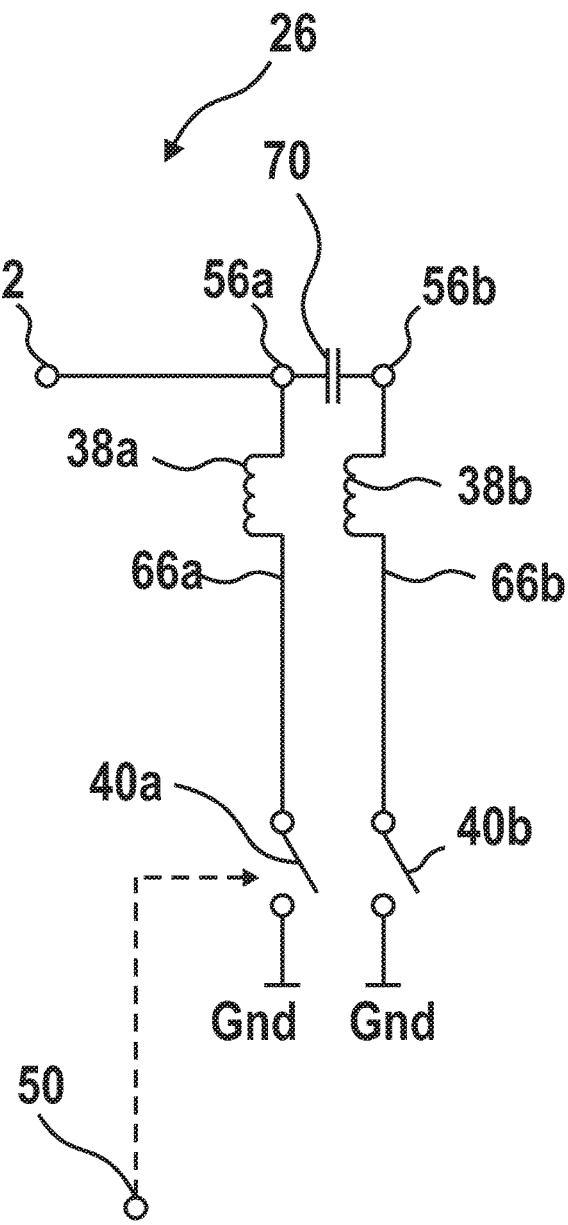
Fig. 12
Fig. 13

DEVICE AND METHOD FOR SWITCHING A FREQUENCY RANGE OF A HIGH FREQUENCY AMPLIFIER

FIELD OF THE DISCLOSURE

The present disclosure generally relates to a high frequency amplifier, a system and a method for setting an operating state of a high frequency amplifier with regard to its operational frequency.

BACKGROUND

High frequency amplifiers, such as Doherty amplifiers, often comprise multiple amplification circuits having different operation points, wherein the amplification circuits automatically provide a contribution to the overall amplification of the high frequency amplifier depending on the respective operation points. In other words, the multiple amplification circuits are generally activated, wherein they provide a contribution to the amplification of the signal to be amplified in dependence of the signal to be amplified, namely the load. Hence, a load modulation is established.

In addition to a first amplification circuit, at least one second amplification circuit may automatically contribute to the amplification which depends on the signal to be amplified, particularly the load, and the respective operation point of the at least one second amplification circuit, which is part of the overall setting of the high frequency amplifier.

The first amplification circuit and the at least one second amplification circuit are connected with a hybrid coupler circuit that combines the signals obtained by the respective amplification circuits in order to obtain a single amplified output signal.

Regarding the frequency of the signals to be processed, it is known that the high frequency amplifier is typically set to a certain frequency band by a termination which is connected with the hybrid coupler circuit, particularly its isolated port. Depending on the kind of termination connected, particularly its characteristics, the high frequency amplifier is optimized with respect to a specific frequency band that is typically narrower than the overall frequency range to be covered. Thus, switching of the termination is necessary in order to change the active frequency band.

The switching of the termination is performed manually by a user of the high frequency amplifier. The manual switching process however requires a manual reconfiguration. This is uncomfortable for the user as the user has to manually interact with the high frequency amplifier, particularly the selection of the respective termination. Moreover, it may also lead to low quality amplification results if the reconfiguration is not performed appropriately, such as by untrained persons.

Hence, there exists a need for a high frequency amplifier providing the possibility to include automated control procedures.

SUMMARY

A summary of certain embodiments disclosed herein is set forth below. It should be understood that these aspects are presented merely to provide a brief summary of these embodiments and that these aspects are not intended to limit the scope of this disclosure. This disclosure may encompass a variety of aspects that may not be set forth below. Some aspects may be described with regard to devices others in view of methods. However, the aspects are correspondingly to be transferred vice versa.

Some embodiments of the present disclosure relate to a high frequency amplifier for amplifying an input signal. In an embodiment, the high frequency amplifier comprises at least a first amplification circuit with a first frequency range, at least one second amplification circuit with a second frequency range, a hybrid coupler circuit with an isolated port, and a termination with at least one switch device. The hybrid coupler circuit is connected to output sides of the first amplification circuit and the second amplification circuit. The termination is connected with the isolated port of the hybrid coupler circuit. The high frequency amplifier has an operating range based on the first amplification circuit and the second amplification circuit. The high frequency amplifier has a load modulation in dependence of the first amplification circuit and the second amplification circuit. A first contact of the at least one switch device of the termination is directly connected to ground.

The efficiency of the amplification of a respective amplification circuit usually depends on the regime at which the amplification circuit is operated. On the one hand, best efficiencies are commonly achieved if the respective amplification circuit is operated close to saturation. In other words, an amplification circuit should generally be operated at high amplification factors close to the respective maximum amplification factor such that high signal-to-noise ratios (SNRs) are achieved. However, an amplification circuit may also be operated in compression or even at saturation in specific circumstances. In some embodiments, modern communication systems use complex signal modulation schemes like OFDM (Orthogonal Frequency Division Multiplexing) with high peak average power ratio (PAPR). Therefore, the amplification circuits may be operated in compression or even at saturation when processing the peaks of the respective signals.

In order to be able to operate a respective amplification circuit at relatively high powers, the overall amplification range corresponding to an overall power range (operating power range) of the high frequency amplifier is divided using multiple amplification circuits. Accordingly, a first amplification circuit, also called a carrier amplifier circuit, is typically operated at all times wherein one or multiple second amplification circuits, also called peak amplifier circuits, automatically contribute to the amplification depending on the load, thereby establishing the load modulation, which is also called dynamic load modulation due to its dynamic and automatic adaption. In other words, the at least one second amplification circuit is used for peak loads in the input signal, thereby establishing the dynamic load modulation. Generally, the dynamic load modulation is obtained since the operation points of the different amplification circuits, e.g. the ones of the first amplification circuit and the second amplification circuit, are set differently. The respective settings of the amplification circuits, namely the operation points set, ensure that the amplification circuits automatically contribute to the amplification depending on the load and their respective setting, namely the operation point.

The first amplification circuit may be coupled to an input port of the high frequency amplifier. Likewise, the at least one second amplification circuit may be coupled to the input port of the high frequency amplifier as well. At the input port, the high frequency amplifier may receive the signal to be amplified. Optionally, additional components may be arranged between the input port and the individual amplification circuits, e.g. a phase shifter (90°), a power divider or rather power splitter.

In some embodiments, the additional component, e.g. the phase shifter, the power divider or power splitter, processes the input signal received via the input port, thereby providing at least two processed signals forwarded to the first amplification circuit and the at least one second amplification circuit for amplifying purposes such that amplified signals are obtained. The amplified signals provided by the respective amplification circuits are combined with each other by the hybrid coupler circuit, thereby providing a single amplified output signal to be forwarded to the output of the amplifier.

The first amplification circuit may be configured to amplify the signal to be amplified up to a first power level, namely in a first power range. The second amplification circuit may be configured to contribute to the amplification of the signal to be amplified in case the power exceeds the first power level. Thus, the load modulation is ensured. In other words, the first amplification circuit and the second amplification circuit may be associated with different amplifier classes. The amplifier classes are typically defined by the respective operation points of the amplification circuits.

Via the hybrid coupler the amplified signals of the first amplification circuit and the at least one second amplification circuit may be coupled or rather combined such that a single amplified output signal of the high frequency amplifier is achieved. As indicated above, this applies for input signals or rather loads causing the at least one second amplification circuit to (automatically) contribute to the amplification. In some embodiments, the single amplified output signal obtained has the desired characteristics.

The at least one switch device of the termination may be an electronically activatable switch. Since the at least one switch device may be electronically activatable, it may be included in an automated amplifier reconfiguration routine according to the operational frequency of the high frequency amplifier. This means that the termination may be selectively connected to the isolated port of the hybrid coupler circuit in an automatic manner Hence, manual reconfiguration may be avoided with regard to the operational frequency. Thereby, a fault rate can be reduced as well since the reconfiguration procedure may not require trained persons.

Usually, the at least one switch device of the termination has to be operated at specific operating conditions. As a consequence of the direct connection of the at least one switch device to ground via its first contact, the at least one switch device may be deheated appropriately in view of the specified operating parameters such that the usability of the switch device is guaranteed for a wide range of possible use cases. For example, automated switching and reconfiguration routines strongly depend on reliability of the switching events if these are triggered. In some embodiments, the deheating relates to an indirect cooling based on (passive) components that absorb the heat of the switch device while being located in its proximity.

Generally, the first frequency range and the second frequency range may be identical. In some embodiments, the first amplification circuit and the second amplification circuit are established in the same manner, but having different operation points.

In other words, the hardware components of the first amplification circuit and the second amplification circuit are similar, but their setting is different in order to obtain the different operation points.

An aspect provides that the ground is associated with a deheating component that is configured, for example, to deheat the at least one switch device during operation of the high frequency amplifier. Accordingly, it is possible to implement the electronically activatable switch such that an operator does not have to switch to the respective frequency band manually by interacting with the at least one switch device. The deheating component may also be directly connected to ground, for example close to the at least one switch device, such that the at least one switch device directly connected to ground can be deheated appropriately.

Another aspect provides that the termination comprises, for example, more than one switch device directly connected to ground. Hence, more than one switch device may be provided, wherein the switch devices are directly connected to ground, thereby ensuring that these switch devices can be deheated easily. Again, this allows to implement electrically controlled switch devices, thereby establishing an automatic reconfiguration of the high frequency amplifier with regard to the operational frequency.

However, the high frequency amplifier, for example the respective termination, may also comprise at least one switch that is not directly connected to ground.

The first amplification circuit and the second amplification circuit each may have a respective operation point, and wherein the respective operation points of the first amplification circuit and the second amplification circuit are set such that the high frequency amplifier is one of a Doherty amplifier, a LINC amplifier, a Chireix amplifier, or an outphasing amplifier. Thus, the high frequency amplifier may be one of a Doherty amplifier, a LINC (linear amplification using nonlinear components) amplifier or a Chireix amplifier, which depends on the respective setting of the amplification circuits, namely the operation points of the amplification circuits.

In some embodiments, the operation point of the second amplification circuit is associated with class C, e.g. in case of operating the high frequency amplifier as a Doherty amplifier. Hence, the second amplification circuit connected in parallel with the first amplification circuit is a C-class peak amplification circuit, which only contributes to the amplification during high power peaks. The operation point of the first amplification circuit may be associated with class AB.

In case of operating the high frequency amplifier as a LINC amplifier or a Chireix amplifier, both amplification circuits may be associated with class AB. In other words, the operation points of both amplification circuits are associated with class AB.

The at least one switch device may be manually activatable. Hence, the variability of the high frequency amplifier may be further improved. In particular, manual activation of the at least one switch device may be performed in addition to an automated controlling thereof. Hence, a manual overriding may be provided. For example, manual activation is achieved via a user interface.

The at least one switch device may be at least one of an electrically controlled mechanical switch, an electronic switch, a pin diode, a transistor, a high-frequency semiconductor switch, and/or a relay. Via these components a reliable switching process may be achieved.

The high frequency amplifier may also comprise at least one phase shifter and/or splitter/divider at an input side of the first amplification circuit and the at least one second amplification circuit. The phase shifter and/or splitter/divider may receive the input signal to be amplified at an input side. Via the phase shifter and/or splitter/divider the input signal to be amplified is processed, thereby obtaining processed signals, which may be provided to the first amplification circuit and the at least one second amplification circuit for further processing, for example amplification.

The termination may further comprise an ohmic resistor, a capacitor and/or an inductance. These respective components define the characteristics of the termination appropriately.

The second frequency range may at least partially comprise the first frequency range. In other words, the first frequency range and the second frequency range may at least partially overlap each other. Also, the first frequency range may be fully included in the second frequency range.

In some embodiments, the first frequency range and the second frequency range are exactly similar. In some embodiments, the first amplification circuit and the at least one second amplification may be identical with regard to their hardware components, but different concerning their setting, e.g. their respective operation points.

According to a further aspect, a control line, via which the switch device is controlled, is coupled to the at least one switch device. In case of an electrically controlled switch device, the switch device may be controlled via the control line accordingly. The control line may be assigned to a control device used to control the at least one switch device of the termination. In some embodiments, the control device may be an integrated control device that is part of the high frequency amplifier or rather a separately formed control device.

The high frequency amplifier may comprise a control device. The control device may be coupled to the switch device, for example via the control line. The control device is coupled to the at least one switch device for controlling the switching state of the at least one switch device, for example via the control line. Hence, the high frequency amplifier may comprise an integrated control device that is used to selectively activate or rather deactivate the switch device. The switch device may be automatically actuated by the control device depending on an input signal of the high frequency amplifier, for example the frequency of the input signal. The control signal used for triggering the switch device is forwarded to the switch device via the control line.

Typically, the respective frequency of the input signal is known since the signal source may be associated with the high frequency amplifier such that the information concerning the frequency can be exchanged. For instance, a radio station comprises the high frequency amplifier and the signal source, for example an exciter used for controlling. Accordingly, the high frequency amplifier is aware of the frequency of the signal to be amplified such that it is not necessary to sense the frequency of the signal to be amplified. The exciter may be used as the control device, which controls the at least one switch device accordingly.

Since the switch device may be triggered depending on the frequency of the input signal, the frequency of the input signal may be sensed and/or evaluated in order to generate the control signal in case the frequency is not known.

Accordingly, the control device may be coupled to at least one sensing device. The at least one sensing device may be configured and arranged such that it may determine the frequency of the input signal to be amplified. For example, the at least one sensing device may determine the frequency of the signal to be amplified. Depending on the frequency of the signal to be amplified, the at least one switch device may be triggered by the control device.

Furthermore, a system is provided that comprises a control device and the high frequency amplifier described above, wherein the control device is separately formed with respect to the high frequency amplifier. As indicated above, the system may relate to a radio station. The control device may be the exciter.

Some of the embodiments of the present disclosure relate to a method for setting an operating state of a high frequency amplifier with regard to its operational frequency. The at least one switch device directly connected to ground is controlled in order to set the operating state of the high frequency amplifier with regard to its operational frequency. The high frequency amplifier is configured according to the aforementioned aspects. The at least one switch device may be electrically controlled, thereby ensuring an automatic frequency band selection.

In an embodiment, the method may include any of the details which are mentioned herein with regard to the high frequency amplifier.

For example, the at least one switch device may be automatically controlled based on a control device. This can be ensured due to the fact that the at least one switch device is directly connected to ground, thereby ensuring a deheating of the at least one switch device.

Alternatively, the at least one switch device is manually controlled. The manual controlling may relate to an overriding in case the user wants to use a certain frequency band different to the one automatically selected.

Throughout the present disclosure RF signals (high frequency signals) may have a frequency within the range of 1 MHz to 100 GHz. High frequency applications are used in manifold applications nowadays.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIGS. 2 to 19 each show a schematic drawing of a specific termination to be connected to an isolated port of the hybrid coupler circuit of the high frequency amplifier, wherein the termination comprises a switch device.

DETAILED DESCRIPTION

The detailed description set forth above in connection with the appended drawings, where like numerals reference like elements, are intended as a description of various embodiments of the present disclosure and are not intended to represent the only embodiments. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

Figure 1:
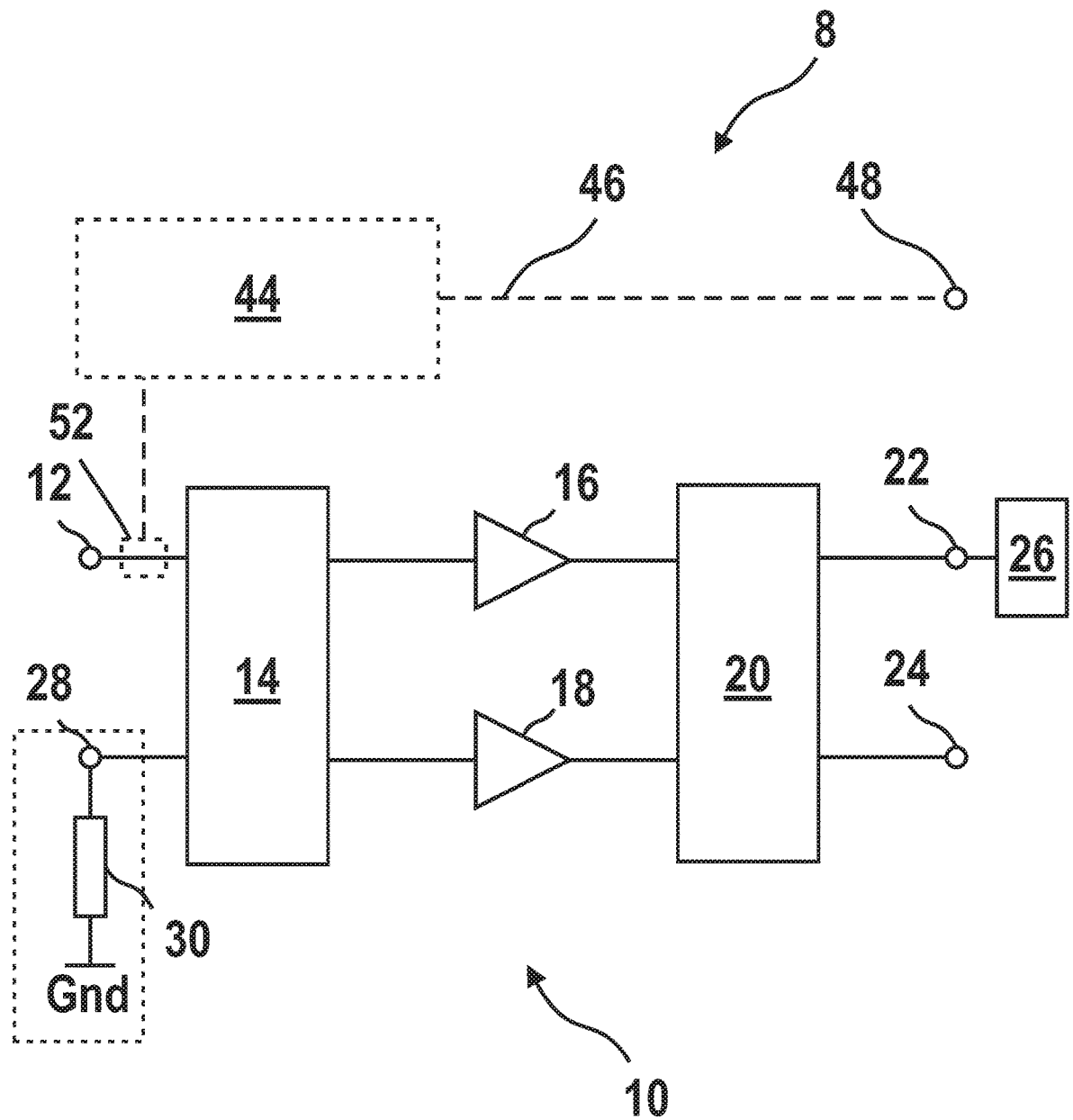
FIG. 1 is a schematic drawing of a system comprising a high frequency amplifier according to an embodiment of the invention.

FIG. 1 is a schematic drawing of a system 8 with a high frequency amplifier 10 according to an embodiment of the present disclosure. As shown in FIG. 1, the high frequency amplifier 10 comprises a first input port 12 where it receives an input signal which is to be amplified. The first input port 12 is coupled to a processing component 14, e.g. a phase shifter, a (power) splitter or rather a (power) divider. Generally, the processing component 14 may relate to an electronic circuit that processes the input signal received from the first input port 12.

In some embodiments, the processing component 14 is configured to split/divide the input signal and/or to phase shift the input signal, thereby obtaining processed signals, which are also called signal portions, as they are obtained by processing the input signal by the processing component 14. These separate processed signal or rather signal portions obtained are subsequently forwarded to a first amplification circuit 16 and at least one second amplification circuit 18 which are arranged in parallel as shown in FIG. 1.

In an alternative, the high frequency amplifier 10 may comprise additional second amplification circuits, e.g. two or three additional second amplification circuits or even more. Hence, the processing component 14 has to be adapted accordingly.

The first amplification circuit 16 is configured to amplify the signal received from the processing component 14 according to a first frequency range. The second amplification circuit 18 is configured to amplify the signal received from the processing component 14 according to a second frequency range. Typically, both amplification circuits 16, 18 are similar such that their frequency ranges equal each other. However, the respective operation points of the amplification circuits 16, 18 are different, resulting in different power operating ranges of the amplification circuits 16, 18. In some embodiments, the second amplification circuit 18 may be used for processing peak loads and, thus, the second amplification circuit 18 is also called peak amplification circuit, for example in case of operating the high frequency amplifier 10 as a Doherty amplifier.

Depending on the respective load, both amplification circuits 16, 18 provide amplified signals when amplifying the signal portions received, e.g. the processed signals.

At the output sides of the first amplification circuit 16 and the second amplification circuit 18, a hybrid coupler circuit 20 is arranged that receives the amplified signal(s) of the amplification circuits 16, 18. The hybrid coupler circuit 20 is configured to combine the individually amplified signals received from the first amplification circuit 16 and the second amplification circuit 18, respectively.

The hybrid coupler circuit 20 comprises an isolated port 22 and an output port 24 for outputting the single amplified output signal, which corresponds to the output signal of the high frequency amplifier 10. The isolated port 22 is connected with a termination 26, examples of which are shown, for example, in FIGS. 2-19.

Generally, the high frequency amplifier 10 has an operating range based on the first amplification circuit 16 and the second amplification circuit 18, namely a power operating range that is defined by the respective settings of the amplification circuits 16, 18, e.g. their operating points. Since the at least one second amplification circuit 18 contributes to the amplification based on the power, namely the load, of the input signal, the high frequency amplifier 10 has a respective load modulation that dynamically and automatically adapts to the load.

Due to the respective operation points of the amplification circuits 16, 18, the respective contributions of the amplification circuits 16, 18 are set. The respective operation points may be set such that the high frequency amplifier 10 is one of a Doherty amplifier, a LINC amplifier, or a Chireix amplifier.

For the Doherty amplifier, the second amplification circuit 18 may be set such that its operation point is associated with class C. Put differently, the second amplification circuit 18 is of class C. For the LINC amplifier or the Chireix amplifier, the second amplification circuit 18 may (in addition to the first amplification circuit 16) be set such that its operation point is associated with class AB. Put differently, the second amplification circuit 18 is of class AB in this example.

As further shown in FIG. 1, the processing component 14 is also coupled to a second input port 28. However, the second input port 28 is terminated with a resistor 30 which is connected to ground GND. In the shown embodiment, the processing component 14 may relate to a hybrid coupler, e.g. a 3 dB hybrid coupler. Hence, a bridge circuit, for example a 90° bridge circuit, is provided, as the second input port 28 is terminated by the resistor 30. This arrangement may be used in case the high frequency amplifier 10 is (operated as) a Doherty amplifier.

However, in case the high frequency amplifier 10 is (operated as) a LINC amplifier, a Chireix amplifier or an outphasing amplifier, the processing component 14 may relate to a splitter, ensuring a different phase relationship of the signals provided at the outputs of processing component 14 compared to the hybrid coupler (used for the Doherty amplifier). Hence, the resistor 30 (together with the second input port 28) can be omitted in this case, as schematically illustrated by the dashed lines in FIG. 1. For instance, a Wilkinson power divider is used for the processing component 14.

Figure 2:
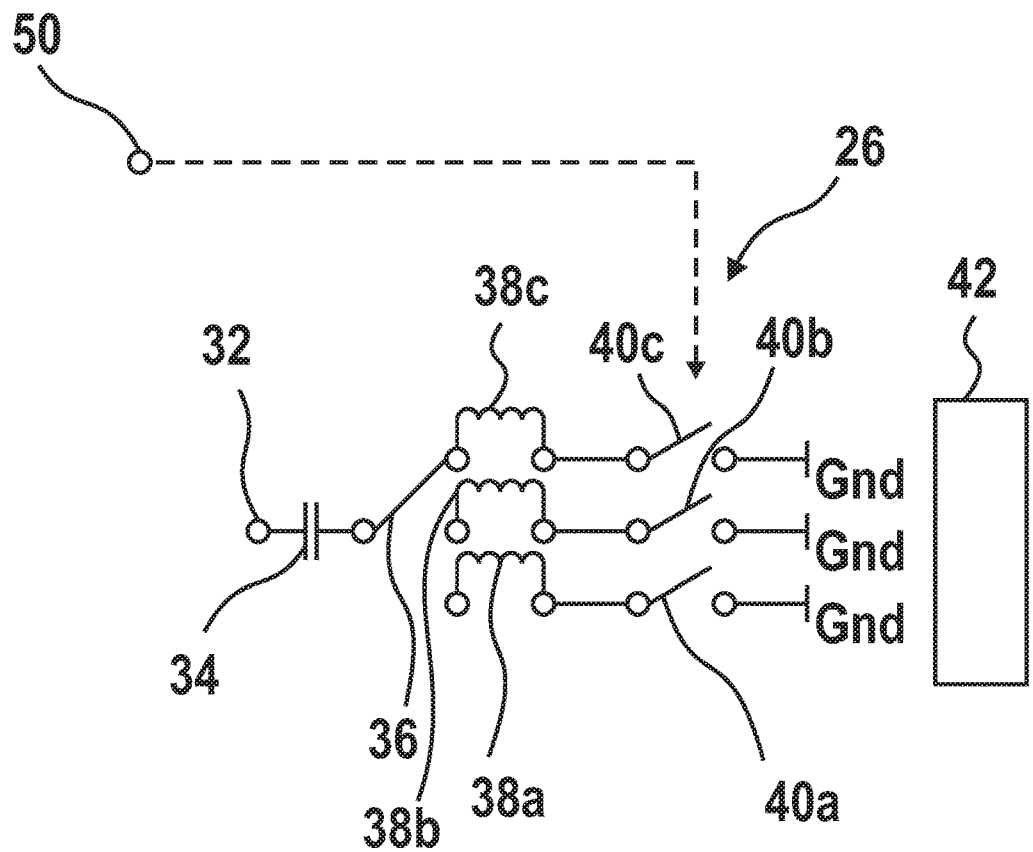

FIG. 2 schematically illustrates an example circuit of the termination 26 that is connected to the isolated port 22 shown in FIG. 1, wherein the termination 26 comprises a connecting node 32, a capacitor 34, a switch 36 and at least one inductance 38 connected in series with the capacitor 34. Generally, the inductance 38 may also be called inductor. For instance, the inductance 38 is a coil.

Moreover, the termination 26 has at least one switch device 40 that is directly connected to ground Gnd via a first contact of the switch device 40. The second contact of the at least one switch device 40 is connected to the at least one inductance 38.

In the shown embodiment, several inductances 38a, 38b, 38c and several switch devices 40a, 40b, 40c are shown that are associated with each other. The different inductances 38a, 38b, 38c have different characteristics, thereby ensuring different properties of the high frequency amplifier 10 depending on the switching state(s) of the switch 36 and the switch devices 40a, 40b, 40c.

Accordingly, the isolated port 22 of the hybrid coupler circuit 20 is coupled to the termination 26 having, depending on the respective switching states, a capacitor 34 and an inductance 38, which are arranged in a series connection, for example with the respective switch device 40 that is directly connected with ground Gnd. Generally, it is sufficient that the termination 26 comprises only one of the inductor 36 and the capacitor 38. Furthermore, the termination 26 may also comprise a resistance as shown in the further embodiments to which reference is made below.

As indicated above, one contact, e.g. the first contact, of the respective switch device(s) 40 is directly connected to ground Gnd. Due to the direct connection to Gnd, the switch device 40 may have a temperature within the respective parameter range of the switch device 40 ensuring proper operational conditions. In some embodiments, the switch device 40 may be appropriately deheated or indirectly cooled such that functionality of the switch device 40 is guaranteed.

For this purpose a deheating component 42 may be associated with the ground Gnd. The deheating component 42 may have a big mass that ensures efficient deheating of the switch device 40 during operation of the high frequency amplifier 10, for example in an indirect manner by establishing a heat transmission. In an embodiment, the deheating component 42 includes a heat sink.

Since several switch devices 40 are directly connected to ground Gnd via their first contacts, efficient deheating of the switch devices 40 is ensured, for example efficient deheating of the entire high frequency amplifier 10.

Moreover, the switch device 40 is associated via its second contact, e.g. the one opposite to the first contact, with the isolated port 22 of the hybrid coupler circuit 20.

In some embodiments, the characteristics of the termination 26 connected to the isolated port 22 of the hybrid coupler circuit 20 may be changed or adapted when controlling the at least one switch device 40 of the termination, thereby changing/adapting the behavior of the hybrid coupler circuit 20, e.g. its frequency response, when processing the amplified signals received from the amplification circuits 16, 18. Hence, the high frequency amplifier 10 can be adapted to a different frequency band by controlling the termination 26 appropriately.

In some embodiments, the controlling of the at least one switch device 40 may be performed by a control device 44, such as a control circuit, that is shown in FIG. 1 by dashed lines. The control device 44 may be integrated within the high frequency amplifier 10, thereby establishing an integrated control device, or may be separately formed with respect to the high frequency amplifier 10 while being part of the system 10. Hence, the control device 44 may be an exciter used to control a signal source providing the signal to be amplified by the high frequency amplifier 10.

Generally, a control line 46 is provided that originates from the control device 44. The control line 46 may end in a control output interface 48 associated with the control device 46, which can be connected with a control input interface 50 associated with the at least one switch device 40. Hence, the control line 46 is coupled to the at least one switch device 40. In any case, the switching state of the respective switch device 40 can be controlled appropriately, for instance automatically via the control line 46.

As discussed above, the controlling of the at least one switch device 40 may be done by the (integrated) control device 44, for example a separately formed control device 44, for instance the exciter. However, a sensor or sensing device 52 shown in FIG. 1 may be associated with the input port 12 that is used for sensing the input signal, for example a frequency of the input signal. The sensing device 52 may be connected with the control device 44 such that the sensed frequency is forwarded to the control device 44. Thus, the control device 44 may control the at least one switch device 40 depending on the frequency sensed.

In an alternative embodiment, the sensing device 52 may be located between the processing component 14 and the first amplification circuit 16 or between the processing component 14 and the second amplification circuit 18, namely downstream of the processing component 14. In any case, the sensing device 52 that is used for sensing the input signal, for example the frequency of the input signal, is located upstream of the amplification circuits 16, 18.

Typically, the frequency of the signal to be amplified is already known, e.g. by the exciter. Hence, it is not necessary to (additionally) sense the frequency. However, this implementation may be used in case of amplifying signals with unknown frequency. Accordingly, an electrical controlling of the switch device 40, for instance an automatic controlling, may be established.

Furthermore, the switch device 40 may also be configured for manual activation according to the wishes of a user of the high frequency amplifier 10. Thus, a manual override may be possible. For example, a user interface may be provided such that closing or opening of the switch device 40 may be manually triggered.

Although according to this embodiment the switch device 40 is depicted as an electronic switch, several different electric and electronic components may be applied to achieve a switching routine. For example, all electric or electronic components may be applied which do not cause any parasitic disturbances. Then, negative influences on the remaining circuit of the high frequency amplifier 10 may be avoided.

As mentioned above, the switch device 40 may be an electrically controlled switch. However, the switch device 40 may also be a mechanical switch that is controlled manually.

In general, the switch device 40 can be an electrically controlled mechanical switch or an electronic switch, e.g. a pin diode, a transistor, a high-frequency semiconductor switch, and/or a relay.

FIGS. 3-19 illustrate additional arrangements of the termination 26 in accordance with embodiments of the disclosure.

Figure 3:
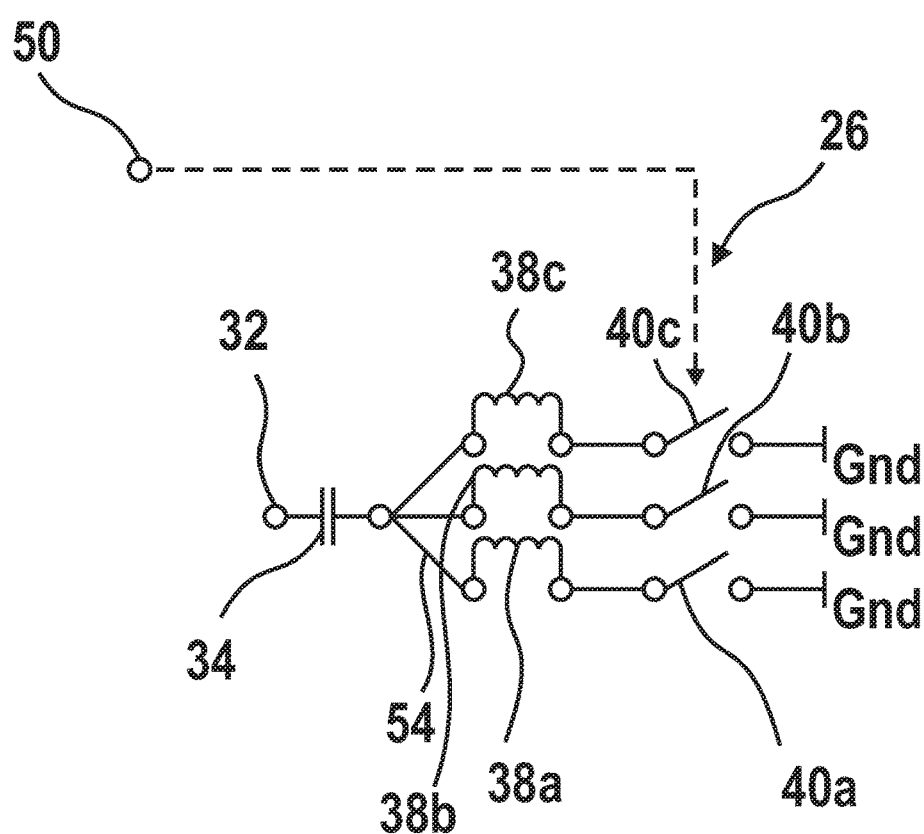

For instance, FIG. 3 shows that the capacitor 34 is directly connected with the inductances 38a, 38b, 38c via lines 54, wherein the inductances 38a, 38b, 38c in turn are connected with the switch devices 40a, 40b, 40c in series.

Figure 4:
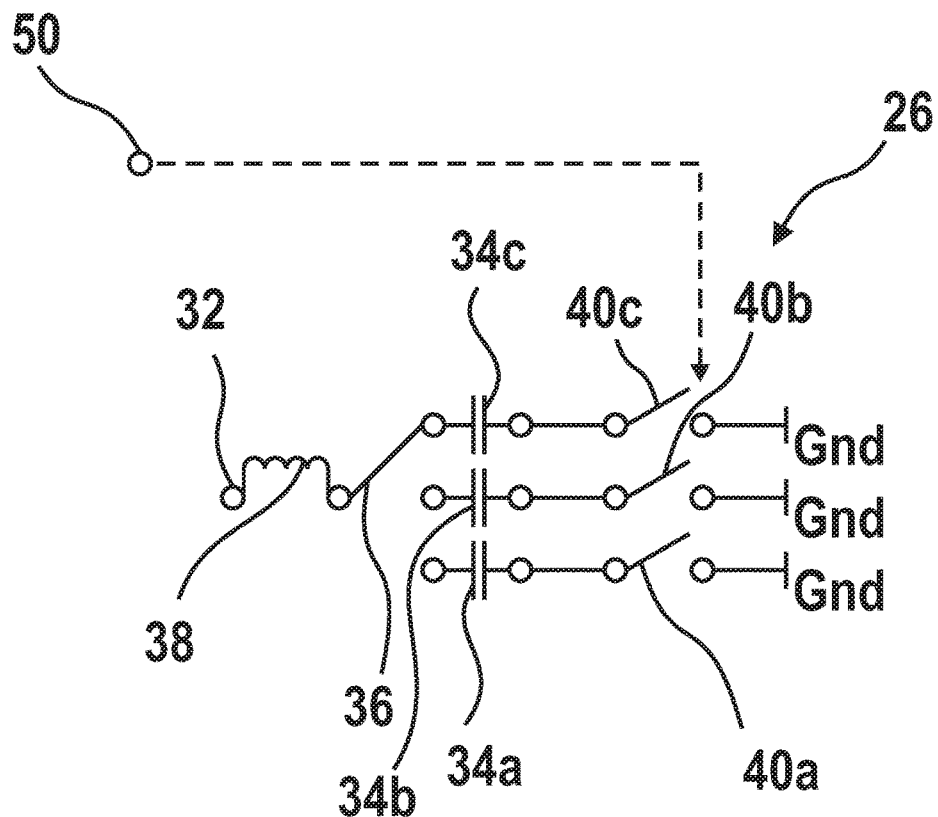

In FIG. 4, a single inductance 38 is provided that is connected via the switch 36 with different capacitors 34a, 34b, 34c that in turn are connected with associated switch devices 40a, 40b, 40c directly connected with ground Gnd.

Figure 5:
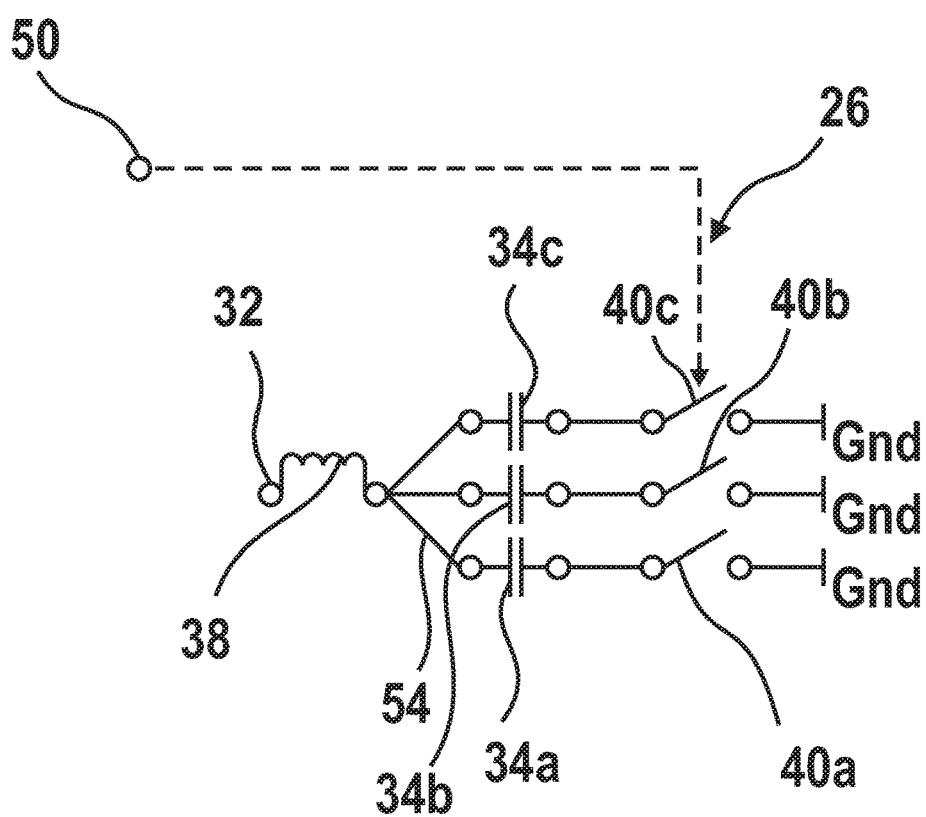

In FIG. 5, the termination 26 also comprises a single inductance 38 is provided that is directly connected with different capacitors 34a, 34b, 34c that in turn are connected with associated switch devices 40a, 40b, 40c directly connected with ground G.

Figure 6:
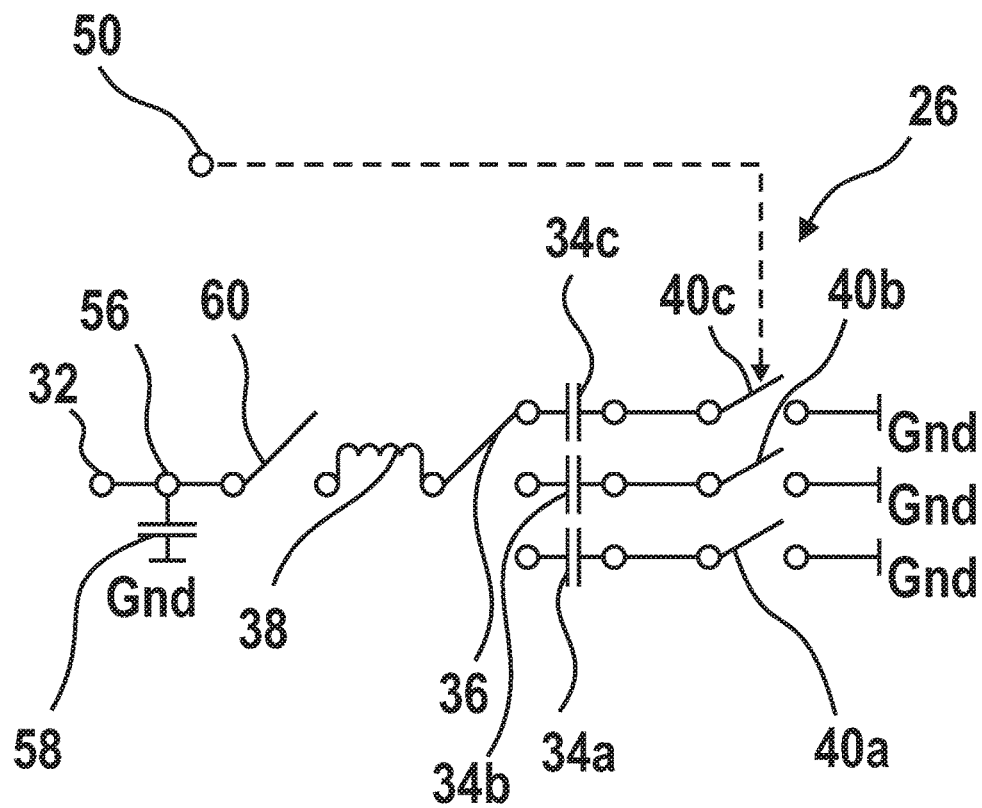

The arrangement of the termination 26 shown in FIG. 6 substantially corresponds to the one shown in FIG. 4. However, the connecting node 32 of the termination 26 is connected via a node 56 with an additional capacitor 58 directly connected to ground Gnd. The single inductance 38 is connected with the node 56 via an additional switch 60. Hence, the additional switch 60 is not directly connected to ground Gnd.

Figure 7:
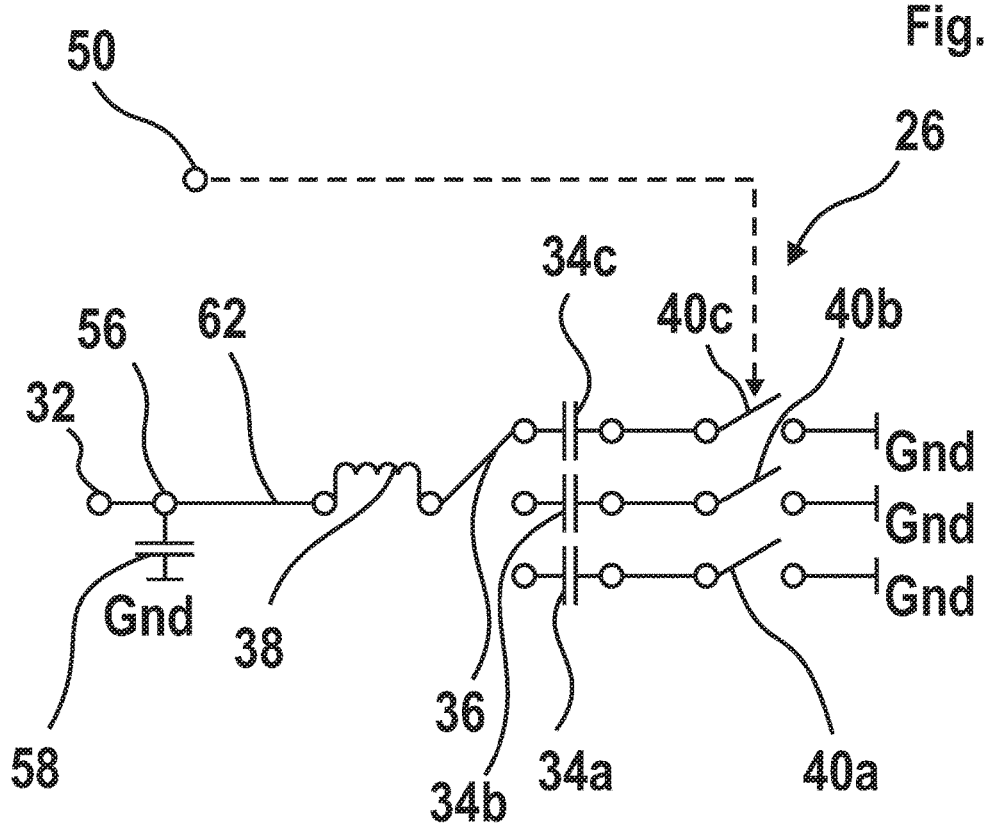

In FIG. 7, another arrangement of the termination 26 is shown that is based on the one shown in FIG. 6. However, the switch 60 has been replaced by a line 62.

Figure 8:
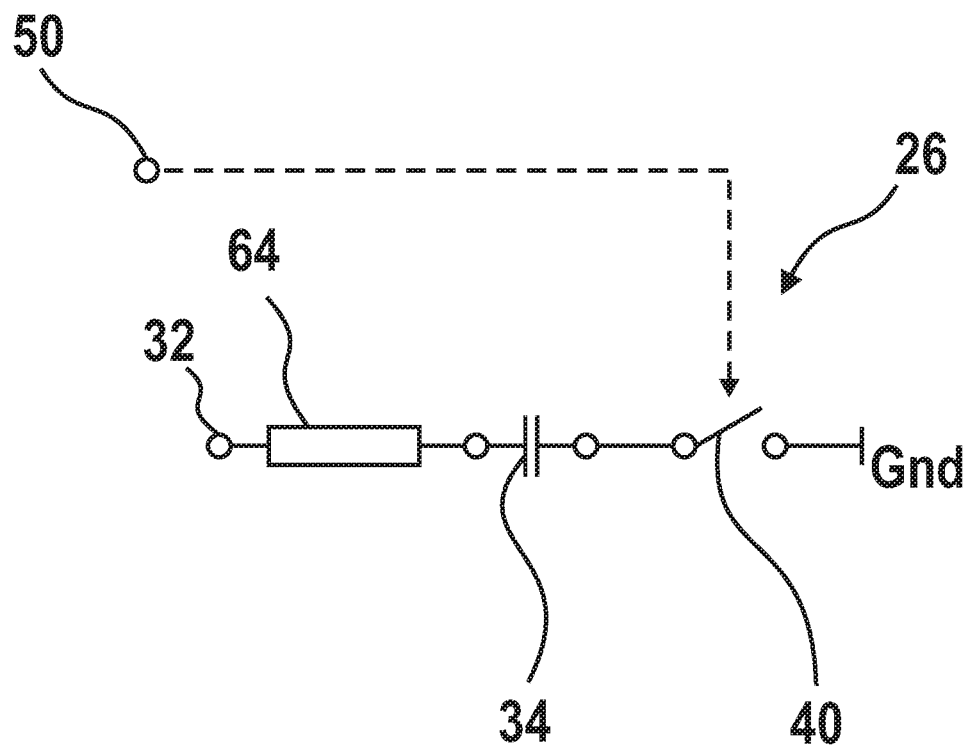

FIG. 8 shows an arrangement of the termination 26 that comprises a resistor 64. In some embodiments, the termination 26 comprises the resistor 64 and the capacitor 34 connected in series. The capacitor 34 is further connected with the switch device 40 in series, which is directly connected to ground Gnd.

Figure 9:
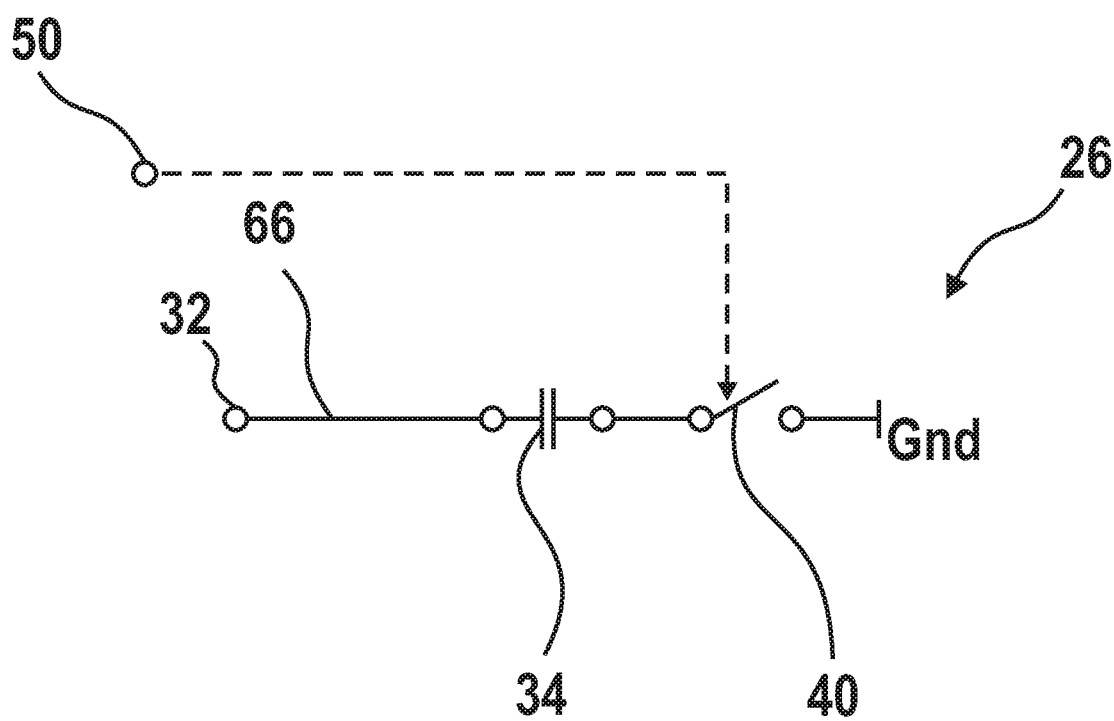

The arrangement of the termination 26 shown in FIG. 9 is based on the one shown in FIG. 8, but the resistor 64 has been replaced by a line 66.

Figure 10:
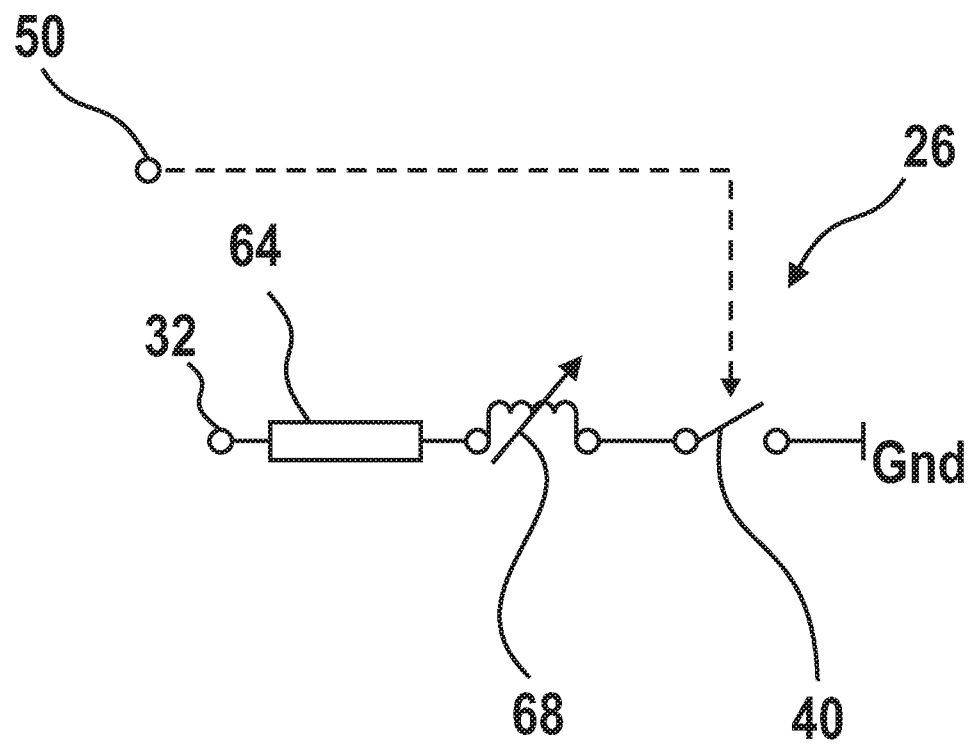

In FIG. 10, an arrangement of the termination 26 is shown that is based on the one shown in FIG. 8, but the capacitor 34 was replaced by an adjustable inductance 68 which is connected in series with the resistor 64 and the switch device 40.

Figure 11:
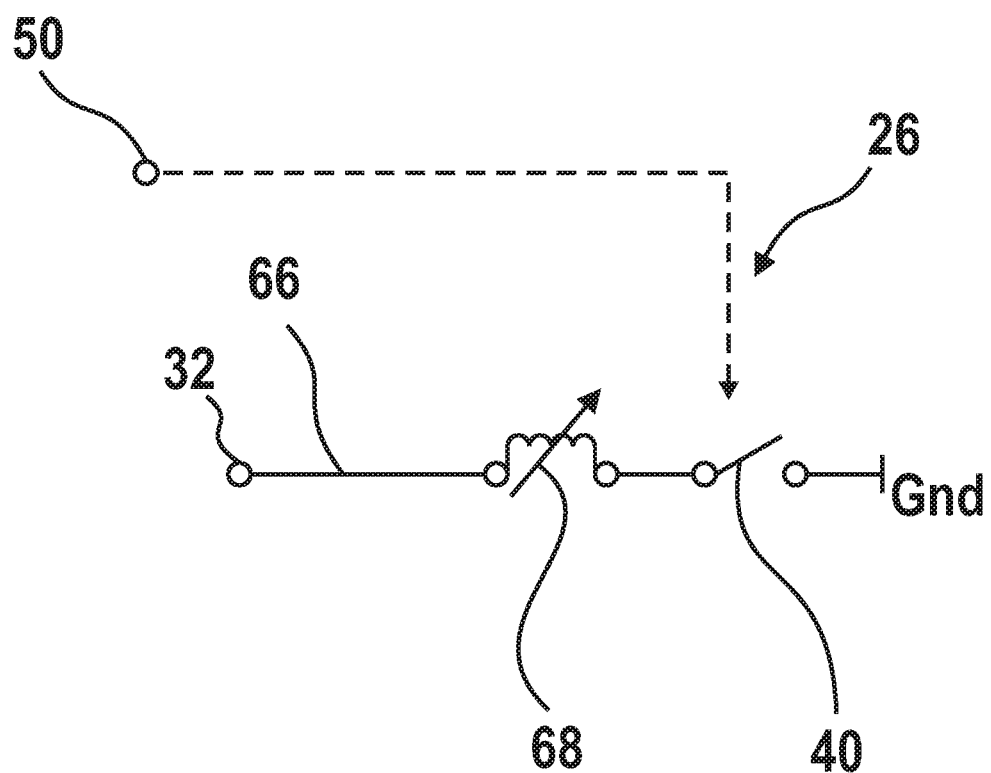

FIG. 11 shows an arrangement of the termination 26 that is a mixture of the arrangements shown in FIGS. 9 and 10. In some embodiments, the termination 26 comprises the connecting node 32 that is connected with the line 66 which is connected in series with the adjustable inductance 68 and the switch device 40.

In FIGS. 12 and 13, different arrangements of the termination 26 are shown, wherein these arrangements each comprise two switch devices 40a, 40b directly connected with ground Gnd. The respective switch devices 40a, 40b are connected with associated inductances 38a, 38b and associated resistors 64a, 64b or rather lines 66a, 66b in series, thereby establishing two lines originating from nodes 56a, 56b. An interleaving capacitor 70 is located between nodes 56a, 56b, namely between the lines.

Figure 14:
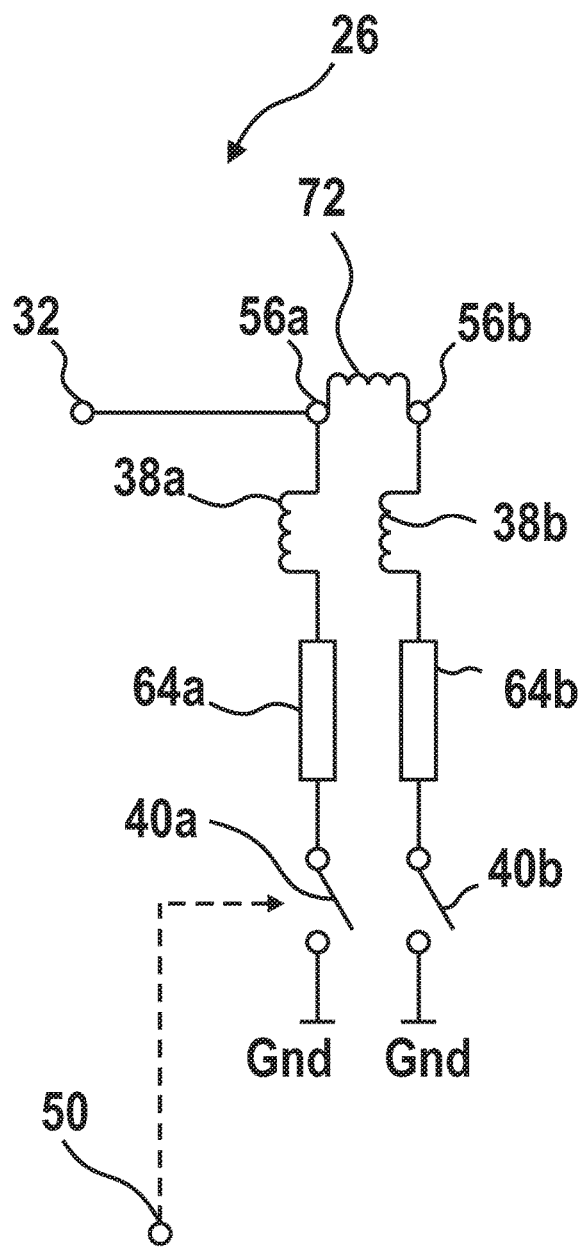
Figure 15:
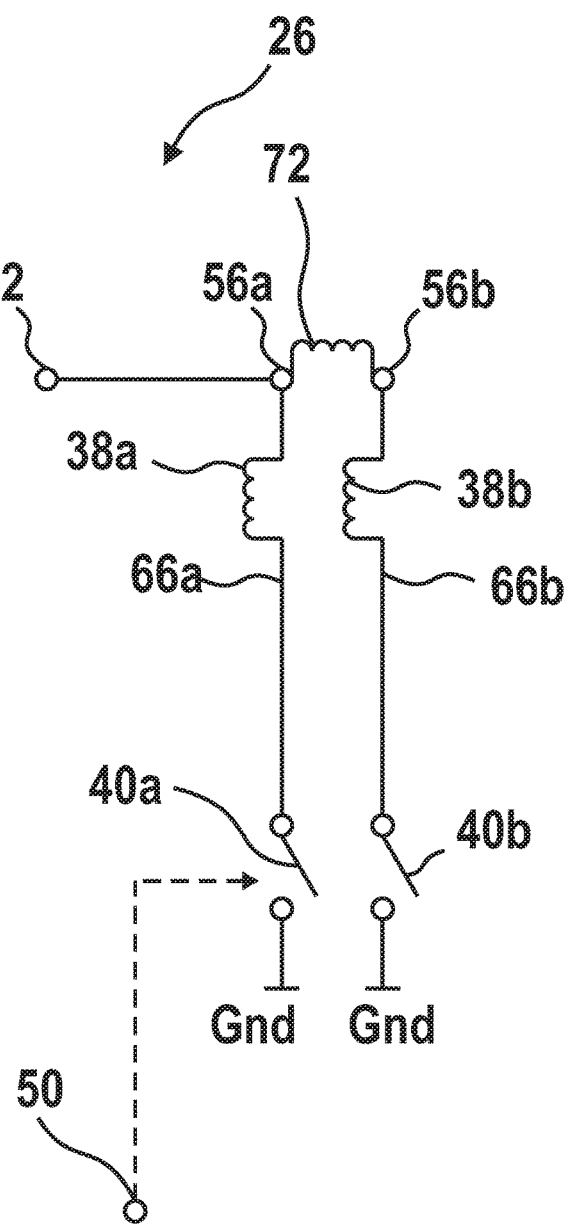

The arrangements of the termination 26 shown in FIGS. 14 and 15 are based on the ones shown in FIGS. 12 and 13. However, the interleaving capacitor 70 has been replaces by an interleaving inductance 72.

Figure 16:
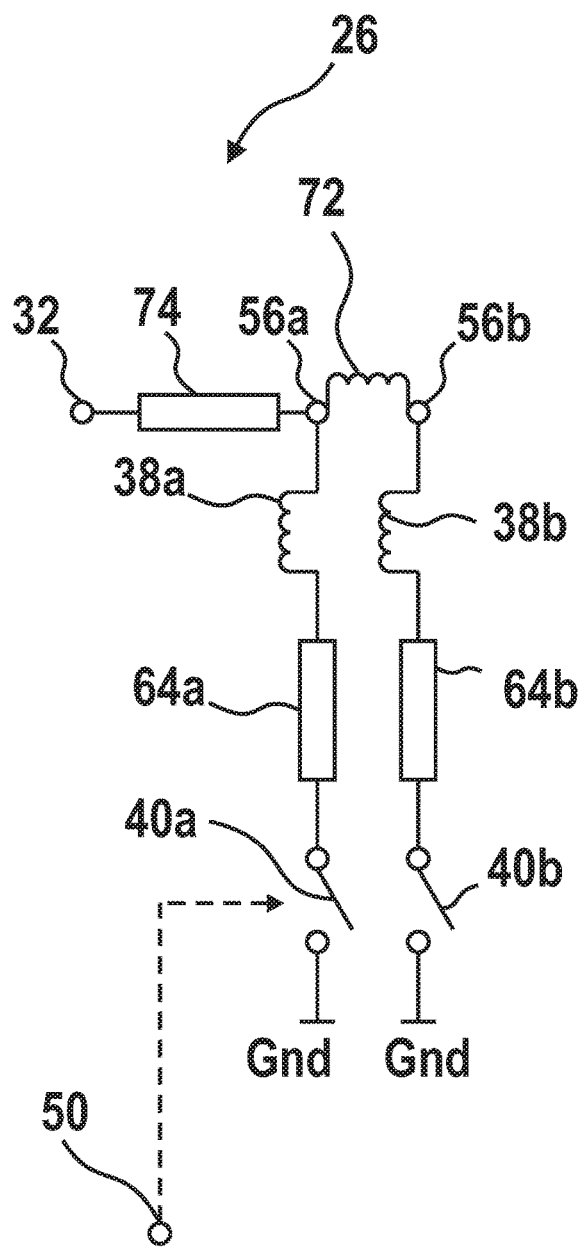
Figure 17:
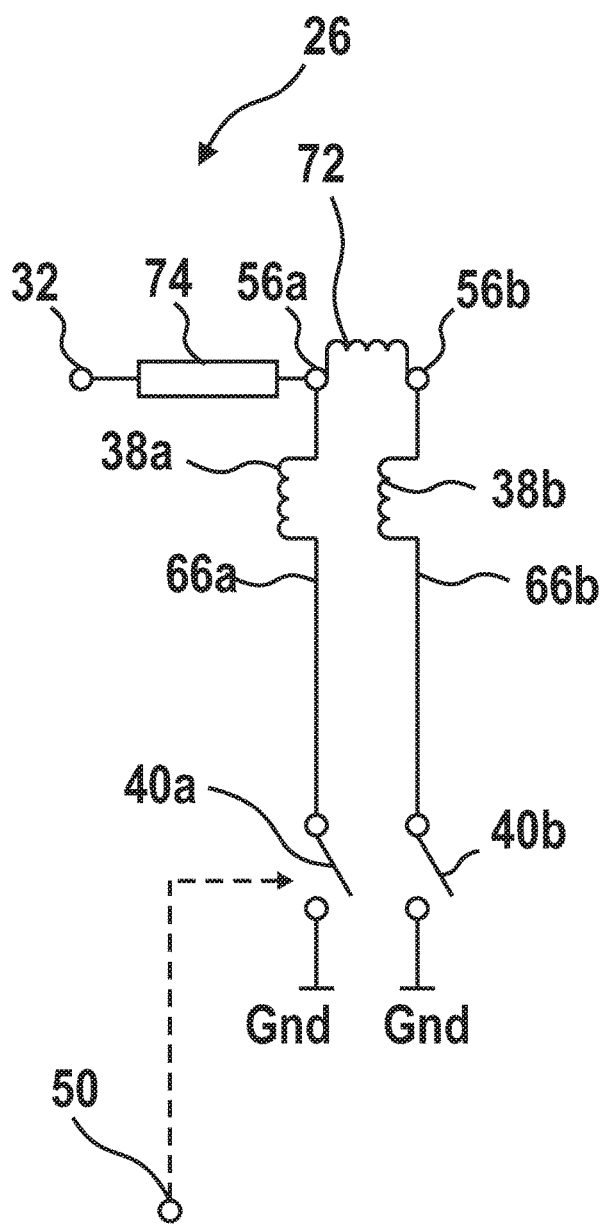

In FIGS. 16 and 17, arrangements of the termination 26 are shown that are based on the ones shown in FIGS. 14 and 15. The respective terminations 26 comprise an additional resistor 74 directly connected with the connecting node 32. Hence, the additional resistor 74 is connected between the connecting node 32 and the first node 56.

Figure 18:
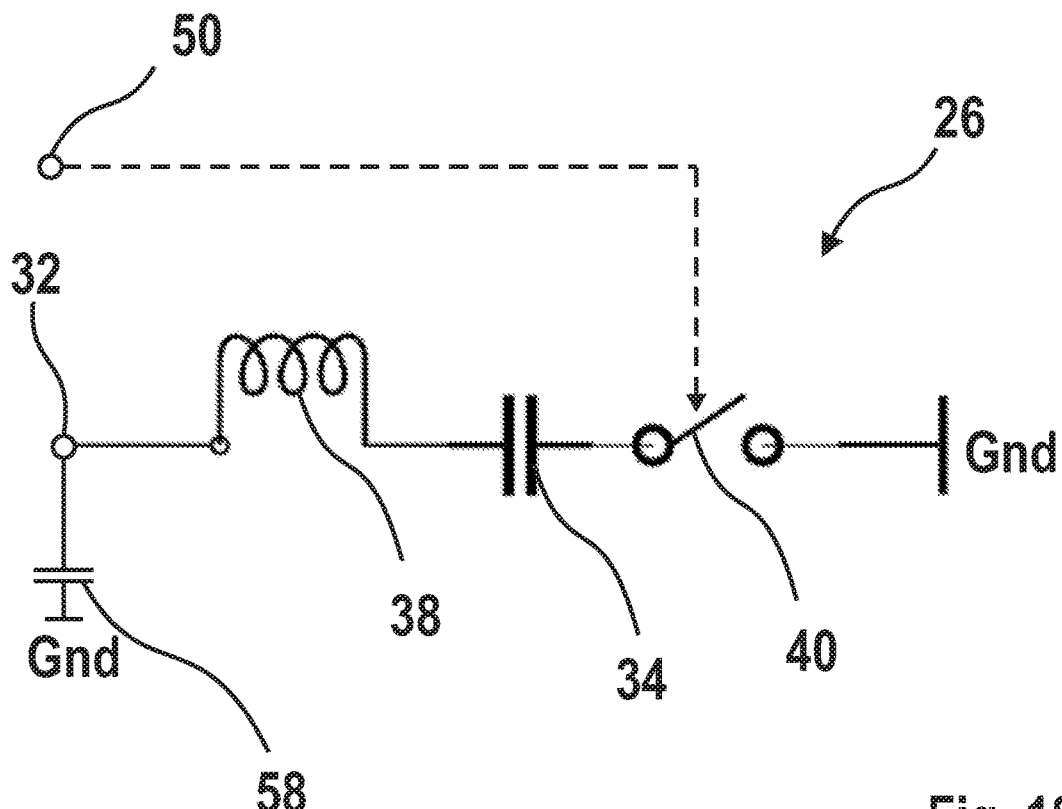

FIG. 18 shows a simpler arrangement of the termination 26 that comprises the connecting node 32 directly connected with the additional capacitor 58 that is directly connected with ground Gnd. In addition, the connecting node 32 is (directly) connected with the single inductance 38 that is connected with the single capacitor 34 and the single switch device 40 in series, which is directly connected to ground Gnd.

Figure 19:
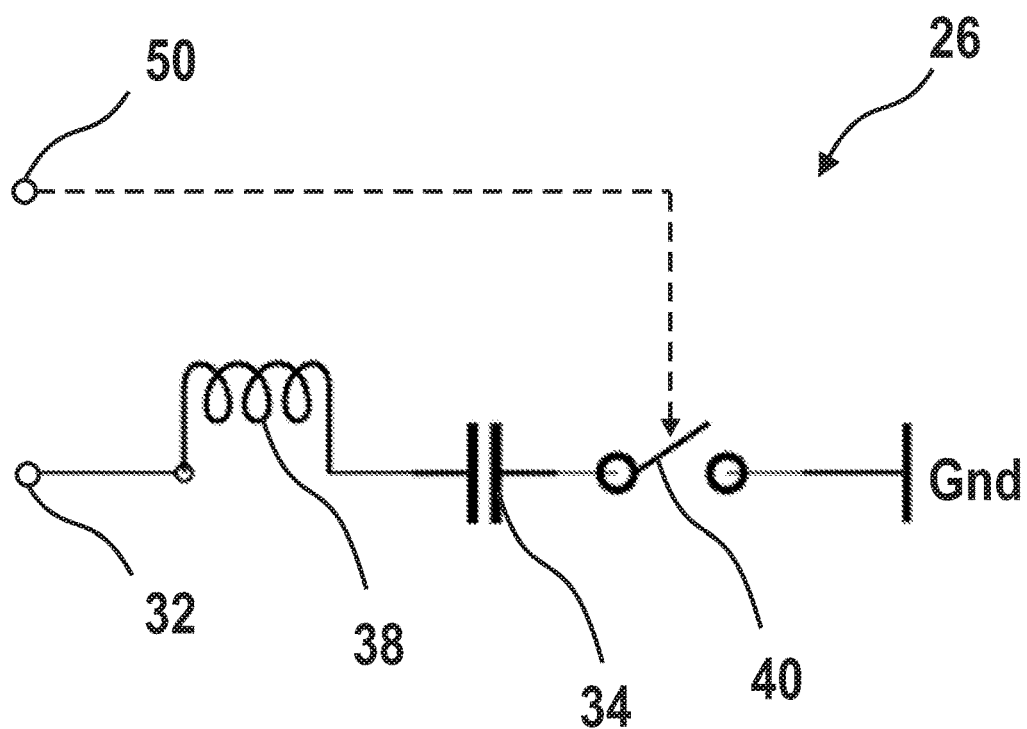

In FIG. 19, the termination 26 only comprises the single inductance 38 that is connected with the single capacitor 34 and the single switch device 40 in series, which is directly connected to ground Gnd.

Generally, each of the different terminations 26 shown in FIGS. 2-19 can be connected with the isolated port 22 of the hybrid coupler circuit 20 shown in FIG. 1. The switch device(s) 40 is controlled (manually or automatically) in order to set the high frequency amplifier 10 with regard to its frequency range or rather its frequency band.

Figure 20:
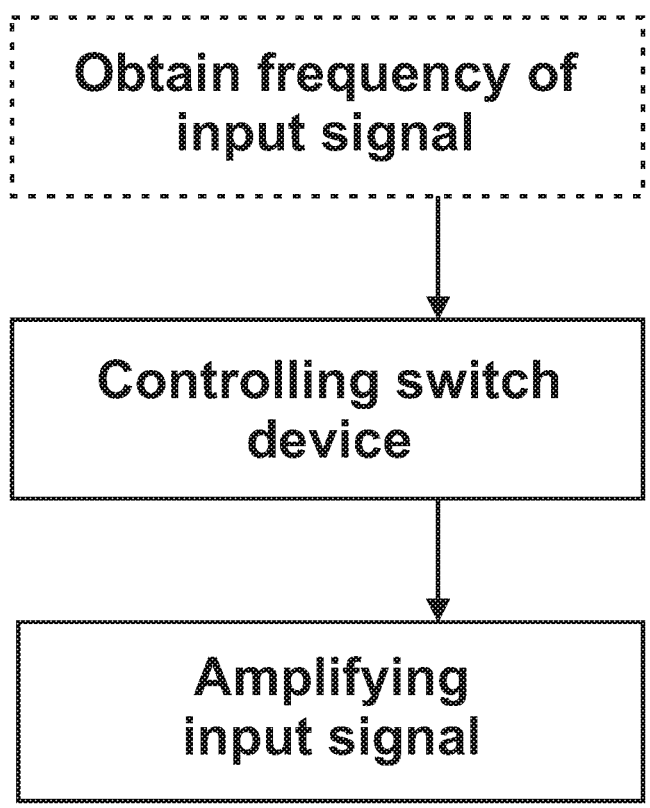
FIG. 20 is a schematic drawing of representative method for setting an operating state of a high frequency amplifier with regard to its operational frequency.

In FIG. 20, different steps of a method for amplifying a signal is shown, which comprises a method for setting an operating state of a high frequency amplifier configured as described above with regard to its operational frequency.

Accordingly, the switch device(s) 40 of the respective termination 26 is controlled manually or rather automatically such that the characteristics of the termination 26 are changed/adapted, thereby altering the characteristics of the hybrid coupler circuit 20 that processes the amplified signals received from the amplification circuits 16, 18.

Therefore, the input signal received by the high frequency amplifier 10 is processed by the amplification circuits 16, 18 accordingly, wherein a single amplified output signal is provided by the high frequency amplifier 10.

As an optional step, the frequency of the input signal has been obtained previously, for example sensed, such that the switch device(s) 40 can be controlled with regard to the frequency of the signal to be amplified.

Generally, the amplifier 10 may relate to a Doherty amplifier, a LINC amplifier, a Chireix amplifier, or an outphasing amplifier.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof.

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

In certain embodiments, circuitry includes special purpose hardware circuit implementations (e.g., implementations in analog circuitry, implementations in digital circuitry, and the like, and combinations thereof) specifically configured to carry out the methodologies and technologies described herein.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

All of the features disclosed above with respect to the example embodiments and/or the accompanying FIGURES can alone or in any sub-combination be combined with features of the aspects of the present disclosure including features of preferred embodiments thereof, provided the resulting feature combination is reasonable to a person skilled in the art.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed

The invention claimed is:

1. A high frequency amplifier for amplifying an input signal, the high frequency amplifier comprising:
    at least a first amplification circuit with a first frequency range;
    at least one second amplification circuit with a second frequency range;
    a hybrid coupler circuit with an isolated port; and
    a termination with at least one switch device, the termination connected with the isolated port,
    wherein the hybrid coupler circuit is connected to output sides of the first amplification circuit and the second amplification circuit,
    wherein the high frequency amplifier has an operating range based on the first amplification circuit and the second amplification circuit,
    wherein the high frequency amplifier has a load modulation in dependence of the first amplification circuit and the second amplification circuit,
    wherein a first contact of the at least one switch device of the termination is directly connected to ground, and
    wherein the ground is associated with a deheating component that is configured to deheat the at least one switch device during operation of the high frequency amplifier.

2. A high frequency amplifier for amplifying an input signal, the high frequency amplifier comprising:
    at least a first amplification circuit with a first frequency range;
    at least one second amplification circuit with a second frequency range;
    a hybrid coupler circuit with an isolated port; and
    a termination with at least one switch device, the termination connected with the isolated port,
    wherein the hybrid coupler circuit is connected to output sides of the first amplification circuit and the second amplification circuit,
    wherein the high frequency amplifier has an operating range based on the first amplification circuit and the second amplification circuit,
    wherein the high frequency amplifier has a load modulation in dependence of the first amplification circuit and the second amplification circuit,
    wherein a first contact of the at least one switch device of the termination is directly connected to ground, and
    wherein the termination comprises more than one switch device directly connected to ground.

3. The high frequency amplifier according to claim 1, wherein the termination comprises more than one switch device directly connected to ground.

4. The high frequency amplifier according to claim 1, wherein the first amplification circuit and the second amplification circuit each have a respective operation point, and wherein the respective operation points of the first amplification circuit and the second amplification circuit are set such that the high frequency amplifier is one of a Doherty amplifier, a LINC amplifier, or a Chireix amplifier.

5. The high frequency amplifier according to claim 4, wherein the operation point of the second amplification circuit is associated with class C.

6. The high frequency amplifier according to claim 1, wherein the at least one switch device is manually activatable.

7. The high frequency amplifier according to claim 1, wherein the at least one switch device is at least one of an electrically controlled mechanical switch, an electronic switch, a pin diode, a transistor, a high-frequency semiconductor switch, and/or a relay.

8. The high frequency amplifier according to claim 1, wherein the termination comprises an ohmic resistor, a capacitor and/or an inductance.

9. The high frequency amplifier according to claim 1, wherein the second frequency range at least partially comprises the first frequency range.

10. The high frequency amplifier according to claim 9, wherein the first frequency range and the second frequency range are exactly the same.

11. The high frequency amplifier according to claim 1, wherein a control line, via which the switch device is controlled, is coupled to the at least one switch device.

12. The high frequency amplifier according to claim 1, wherein the high frequency amplifier comprises a control circuit, wherein the control circuit is coupled to the at least one switch device for controlling the switching state of the at least one switch device.

13. The high frequency amplifier according to claim 12, wherein the switch device is automatically actuated by the control circuit depending on an input signal of the high frequency amplifier.

14. The high frequency amplifier according to claim 13, wherein the switch device is automatically actuated by the control circuit depending on the frequency of the input signal.

15. A method for setting an operating state of a high frequency amplifier configured according to claim 1 with regard to its operational frequency, wherein the at least one switch device directly connected to ground is controlled in order to set the operating state of the high frequency amplifier with regard to its operational frequency.

16. The method according to claim 15, wherein the at least one switch device is automatically controlled based on a control circuit.

17. The method according to claim 15, wherein the at least one switch device is manually controlled.

* * * * *